(12) United States Patent
Sehata et al.

(10) Patent No.: US 8,576,214 B2
(45) Date of Patent: Nov. 5, 2013

(54) DISPLAY DEVICE

(75) Inventors: Hiroko Sehata, Oamishirasato (JP);
Kouichi Kotera, Kokubunji (JP);
Yoshihiro Kotani, Chiba (JP);
Shuuichirou Matsumoto, Mobara (JP)

(73) Assignees: Hitachi Displays, Ltd., Chiba (JP);
Panasonic Liquid Crystal Display Co., Ltd., Hyogo-ken (JP)

( * ) Notice: Subject to any disclaimer, the term of this patent is extended or adjusted under 35 U.S.C. 154(b) by 363 days.

(21) Appl. No.: 12/709,254

(22) Filed: Feb. 19, 2010

(65) Prior Publication Data

US 2010/0238153 A1    Sep. 23, 2010

(30) Foreign Application Priority Data

Mar. 19, 2009    (JP) .................................. 2009-068117

(51) Int. Cl.
*G06F 3/038*   (2013.01)
*G09G 3/36*    (2006.01)

(52) U.S. Cl.
USPC ............. 345/211; 345/98; 345/100; 345/204; 345/89; 345/690; 341/135; 341/144; 330/252; 330/253

(58) Field of Classification Search
USPC ................. 345/55, 87, 89, 211, 98, 204, 690; 323/280; 327/65, 124, 307, 554; 330/9, 330/51, 260–261, 252–253; 341/136, 341/144–160, 135
See application file for complete search history.

(56) References Cited

U.S. PATENT DOCUMENTS

| 5,532,644 | A | 7/1996 | Nakagawara |
| 6,140,872 | A * | 10/2000 | McEldowney ..................... 330/9 |
| 7,369,075 | B2 | 5/2008 | Ishii et al. |
| 2006/0132193 | A1* | 6/2006 | Tsuchi ............................ 327/65 |
| 2008/0062021 | A1* | 3/2008 | Shimatani ..................... 341/118 |

FOREIGN PATENT DOCUMENTS

| JP | 7-235840 | 9/1995 |
| JP | 10-284984 | 10/1998 |
| JP | 2001-034234 | 2/2001 |
| JP | 2003-318676 | 11/2003 |
| JP | 2006-197532 | 7/2006 |
| JP | 2006-310958 | 11/2006 |

OTHER PUBLICATIONS

Design of Analog CMOS Integrated Circuits, Behzad Razavi, Tata McGraw-Hill Publishing Company Limited, pp. 126-128.*

* cited by examiner

*Primary Examiner* — Lun-Yi Lao
*Assistant Examiner* — Md Saiful A Siddiqui
(74) *Attorney, Agent, or Firm* — Antonelli, Terry, Stout & Kraus, LLP.

(57) ABSTRACT

A circuit that obtains a more accurate, output voltage from a plurality of input voltages is provided. A two-input single-output circuit includes a current source transistor allowing a predetermined current to flow, a cascode transistor section including two MOS transistors that are cascode-connected to the drain side of the current source transistor and have the same characteristics, a differential pair section having a first differential pair formed of a first input-side transistor and a first output-side transistor whose source lines are shared and a second differential pair formed of a second input-side transistor and a second output-side transistor whose source lines are shared, and a current mirror circuit section. Drain lines of the transistors of the cascade transistor section are respectively connected to the source lines of the first and second differential pairs.

10 Claims, 12 Drawing Sheets

DISPLAY DEVICE

CROSS-REFERENCE TO RELATED APPLICATION

The present application claims priority from Japanese application JP 2009-068117 filed on Mar. 19, 2009, the content of which is hereby incorporated by reference into this application.

BACKGROUND OF THE INVENTION

1. Field of the Invention

The present invention relates to a multiple-input single-output circuit and a display device, and more particularly to a circuit in which one output voltage is determined based on voltages input from a plurality of input terminals and a display device using the circuit.

2. Background Art

Display devices have been widely used as information communication terminals such as computers or the displaying devices of television receivers. In liquid crystal display devices represented by the display devices, the alignment of liquid crystal molecules sealed between two substrates is changed to change the degree of light transmission, whereby an image to be displayed is controlled. In a driver circuit that drives the display device, a decoder circuit for outputting a voltage corresponding to a gray-scale value for each pixel is mounted. The decoder circuit has been increasing in scale along with an increase in gray-scale level in recent years, which increases an area of the decoder circuit occupying a chip. Therefore, the decoder circuit is required to be miniaturized.

JP-A-2001-34234 discloses a technique of reducing the number of wires for gray-scale and the scale of a decoder by using a two-input amplifier that outputs, when two input voltages are the same, the input voltage and outputs, when they are different from each other, an intermediate voltage between the two voltages.

In the technique, however, it is pointed out that when the difference between the two different, input voltages is large, a voltage to be output is shifted to the high-voltage side. For eliminating the shift to the high-voltage side, JP-A-2006-310958 and JP-A-2005-130332 propose a technique of outputting an intermediate voltage by using two constant current sources and a current mirror circuit.

However, for configuring a circuit having two constant current sources with the same current, a half of the current has to flow into each of the constant current sources. Therefore, it is necessary to make a gate width narrower or a gate length longer. Making the gate length longer leads to an increase in the area of the circuit occupying a chip. On the other hand, making the gate width narrower leads to the difficulty in the process, which might cause deterioration in yield.

SUMMARY OF THE INVENTION

The invention has been made in view of the circumstances, and it is an object of the invention to provide a circuit that obtains a more accurate, output voltage from a plurality of input voltages without using a plurality of current sources.

A display device according to an aspect of the invention includes: a display panel; and a multiple-input single-output circuit supplying a voltage to the display panel, the multiple-input single-output circuit including a first differential pair formed of first and second transistors and a second differential pair formed of third and fourth transistors, a current mirror transistor section connected to drains of the first, second, third, and fourth transistors of the differential pairs, a first input terminal connected to a gate of the first transistor, a second input terminal connected to a gate of the third transistor, an output terminal connected to gates of the second and fourth transistors, a constant current source section allowing a predetermined current to flow, and a cascode transistor section having first and second cascode transistors whose sources are connected to the constant current source, wherein sources of the first and second transistors are connected to the constant current source via the first cascode transistor, and sources of the third and fourth transistors are connected to the constant current source via the second cascode transistor.

For the transistors used in the multiple-input single-output circuit, NMOS (Negative-channel Metal-Oxide Semiconductor) transistors or PMOS (Positive-channel Metal-Oxide Semiconductor) transistors may be used. In addition, even when the names of source and drain of the transistor are different depending on the way of using the transistors and the way of combining a power source line and a grounding wire, the same operation and effect can be obtained, and the technical idea is not different.

In the multiple-input single-output circuit according to the aspect of the invention, gates of the transistors of the cascode transistor section may be connected to each other.

In the multiple-input single-output circuit according to the aspect of the invention, the number of the transistors included in the cascade transistor is the same as that of the differential pairs, and drains of the cascade transistors are connected to sources of the differential pairs.

The multiple-input single-output circuit according to the aspect of the invention includes a third differential pair, in which an input terminal of the third differential pair is connected to the input terminal of the first transistor.

The display device according to the aspect of the invention includes a drive circuit having any of the multiple-input single-output circuits described above.

DETAILED DESCRIPTION OF THE EMBODIMENTS

Figure 1:
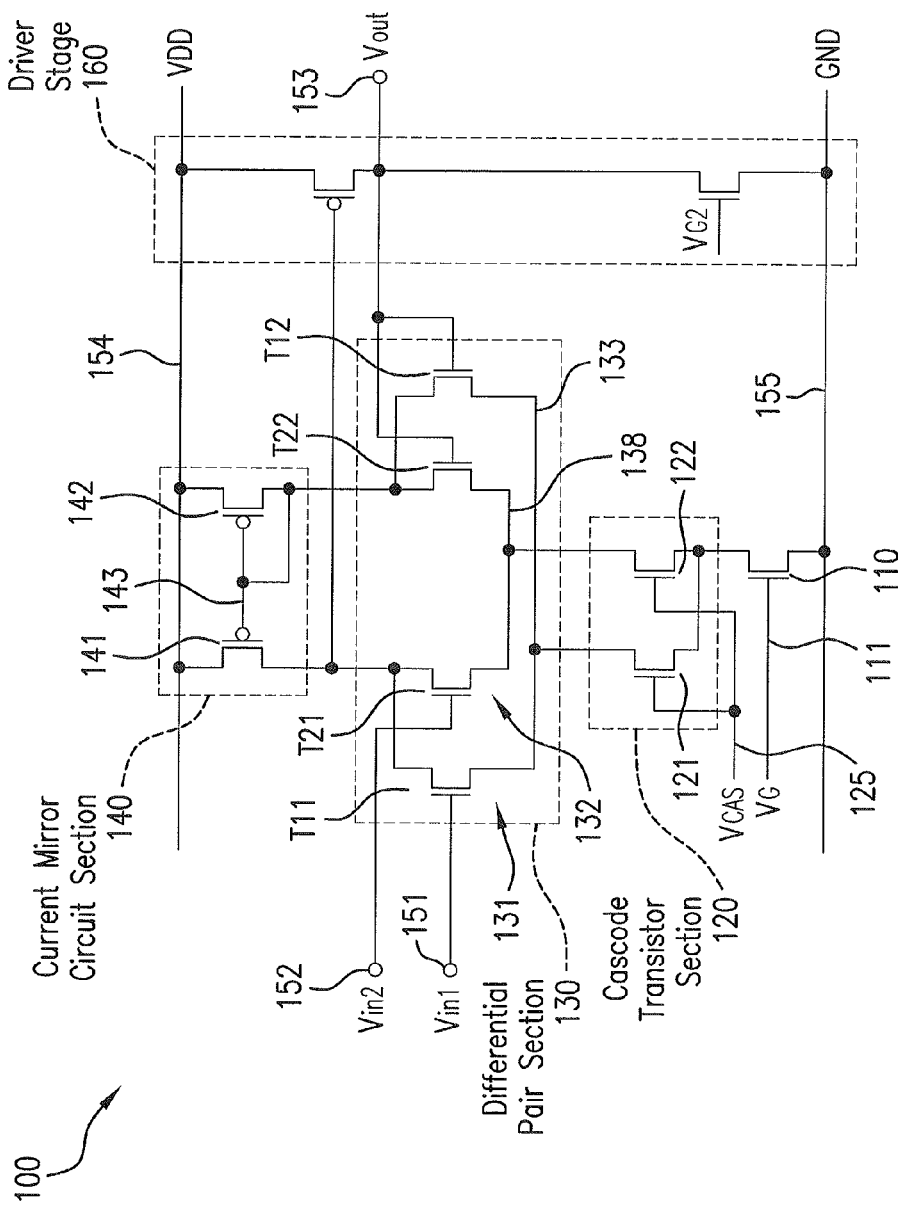
FIG. 1 shows a two-input single-output circuit according to a first embodiment of the invention.

Hereinafter, first to fourth embodiments of the invention will be descried with reference to the drawings. In the drawings, the same or similar elements are denoted by the same reference numerals, and the repetitive description thereof is omitted.

First Embodiment

FIG. 1 shows a two-input single-output circuit 100 according to an embodiment of a multiple-input single-output circuit of the invention. As shown in the drawing, the two-input single-output circuit 100 includes a current source transistor 110, a cascode transistor section 120, a differential pair section 130, and a current mirror circuit section 140. The current source transistor 110 is connected to a grounding wire 155 at a source thereof. When a predetermined voltage $V_G$ is applied to a gate of the current source transistor 110, the current source transistor 110 allows a predetermined current to flow. The cascode transistor section 120 is formed of two MOS transistors 121 and 122 cascode-connected to the drain side of the current source transistor 110 and having the same characteristics. The differential pair section 130 has a first differential pair 131 formed of a first input-side transistor T11 and a first output-side transistor T12 whose sources are electrically connected to each other and a second differential pair 132 formed of a second input-side transistor T21 and a second output-side transistor T22 whose sources are electrically connected to each other. The current mirror circuit section 140 includes transistors 141 and 142 whose drain lines are connected to a power source line 154 and whose gate lines 143 are connected to each other. The same voltage is applied to the transistors, so that they allow the same current to flow.

A drain of the transistor 121 of the cascode transistor section 120 is connected to a common source line 133 of the first differential pair 131. A drain of the transistor 122 of the cascode transistor section 120 is connected to a common source line 138 of the second differential pair 132.

Drains of the first input-side transistor T11 of the first differential pair 131 and the second input-side transistor T21 of the second differential pair 132 are both connected to a drain of the transistor 141 which is one of the transistors of the current mirror circuit section 140. Drains of the first output-side transistor T12 of the first differential pair 131 and the second output-side transistor T22 of the second differential pair 132 are both connected to a drain of the other transistor 142 of the current mirror circuit section 140.

A gate of the first input-side transistor T11 of the first differential pair 131 is connected to a first input terminal 151. A gate of the second input-side transistor T21 of the second differential pair 132 is connected to a second input terminal 152. A gate of the first output-side transistor T12 of the first differential pair 131 and a gate of the second output-side transistor T22 of the second differential pair 132 are connected to an output terminal 153. A gate line 125 of the transistors 121 and 122 of the cascode transistor section 120 is at an identical cascode transistor gate voltage $V_{cas}$.

The transistors T11, T12, T21, and T22 of the differential pair section 130 have the same characteristics. Input voltages $V_{in1}$ and $V_{in2}$ are applied to the first and second input terminals 151 and 152, respectively. A driver stage 160 including a P-channel MOS transistor whose source line is connected to the output terminal 153 and a constant current source for driving the P-channel MOS transistor is connected to the two-input single-output circuit 100.

Figure 2:
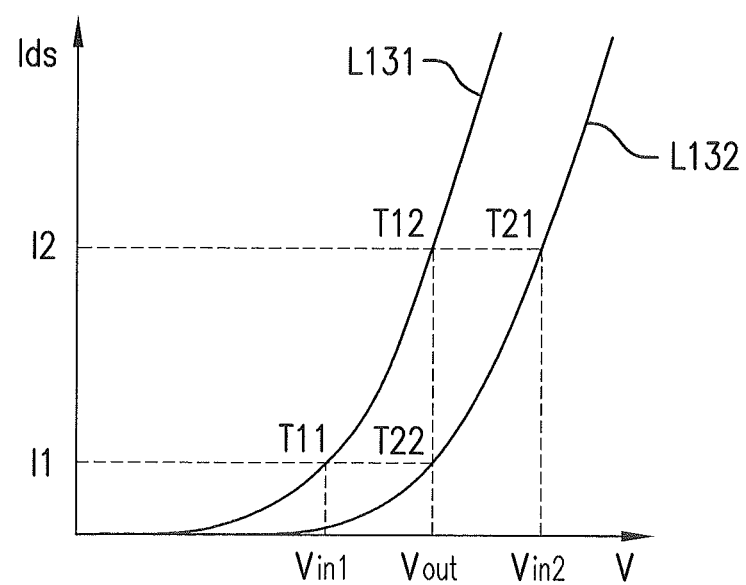
FIG. 2 is a graph showing the relationship between a current between the drain and source of each of transistors of a differential pair section and a gate voltage.

Hereinafter, the operation of the two-input single-output circuit 100 will be described. FIG. 2 shows a graph showing the relationship between a current between the drain and source of each of the transistors T11, T12, T21, and T22 of the differential pair section 130 and a gate voltage. A line L131 in the drawing represents the characteristics of the transistors T11 and T12 of the first differential pair 131, while a line L132 represents the characteristics of the transistors T21 and T22 of the second differential pair 132.

Since the transistors have the same characteristics as described above, the lines L131 and L132 have the same shape. However, when the input voltages $V_{in1}$ and $V_{in2}$ are different from each other, a source voltage of the first differential pair 131 and a source voltage of the second differential pair 132 are different from each other. Therefore, the line L132 of the second differential pair 132 is parallel-shifted from the line L131 of the first differential pair 131 according to the difference between the source voltages.

In this case, when currents flowing into the transistors T11, T12, T21, and T22 are respectively defined as $I_{T11}, I_{T12}, I_{T21}$, and $I_{T22}$ the relationship of $(I_{T11}+I_{T21}=I_{T12}+I_{T22})$ is established because currents flowing into the transistors 141 and 142 of the current mirror circuit section 140 are equal to each other. Moreover, the relationship of $(I_{T11}+I_{T12}=I_{T21}+I_{T22})$ is established because currents flowing into the transistors 121 and 122 of the cascode transistor section 120 are equal to each other. When these two relational expressions are solved, it is understood that the relationships of $(I_{T12}=I_{T21})$ and $(I_{T11}=I_{T22})$ are established.

Accordingly, the same amount of current as that flowing into the transistor T21 flows into the transistor T12, while the same amount of current as that flowing into the transistor T11 flows into the transistor T22. Returning to FIG. 2, when the current relationship and the fact that the gate voltages of the transistors T12 and T22 are at the same potential are used, the difference between the input voltage $V_{in1}$ and an output voltage $V_{out}$ equals the difference between the input voltage $V_{in2}$ and the output voltage $V_{out}$ on the graph because the lines L131 and L132 have the same shape graph as described above. Therefore, it is understood that the output voltage $V_{out}$ is an intermediate voltage between the input voltages $V_{in1}$ and $V_{in2}$.

According to the first embodiment, therefore, it is possible to configure a circuit that outputs an intermediate voltage without subdividing the current source transistor 110 and to drive the circuit with a stable current because one current source transistor 110 is used. Moreover, since the current source transistor 110 determines a current, a transistor having an appropriate size can be selected for each of the transistors 121 and 122 of the cascode transistor section 120.

According to the first embodiment, therefore, it is possible to obtain an output voltage of a more accurate, intermediate voltage from two input voltages without using a plurality of current sources.

Figure 3:
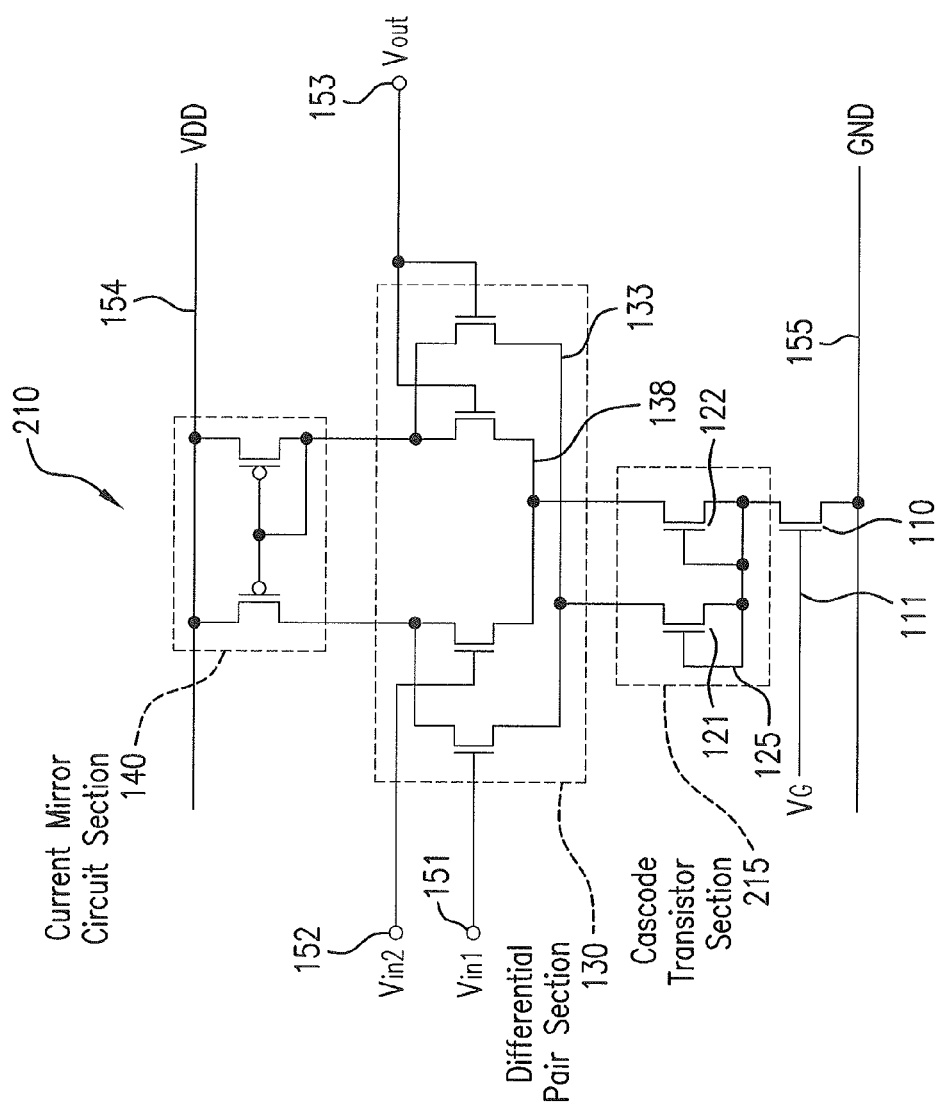
FIG. 3 shows a two-input single-output circuit according to a first modification of the first embodiment.

FIG. 3 shows a two-input single-output circuit 210 according to a first modification of the two-input single-output circuit 100 of the first embodiment. In the drawing, the driver stage 160 in FIG. 1 is not illustrated. A configuration portion different from the two-input single-output circuit 100 of the first embodiment is a cascode transistor section 215. The other configurations are the same as those of the two-input single-output circuit 100. The gate lines 125 of the transistors 121 and 122 of the cascode transistor section 215 are connected to a common source line unlike the first embodiment.

Figure 4:
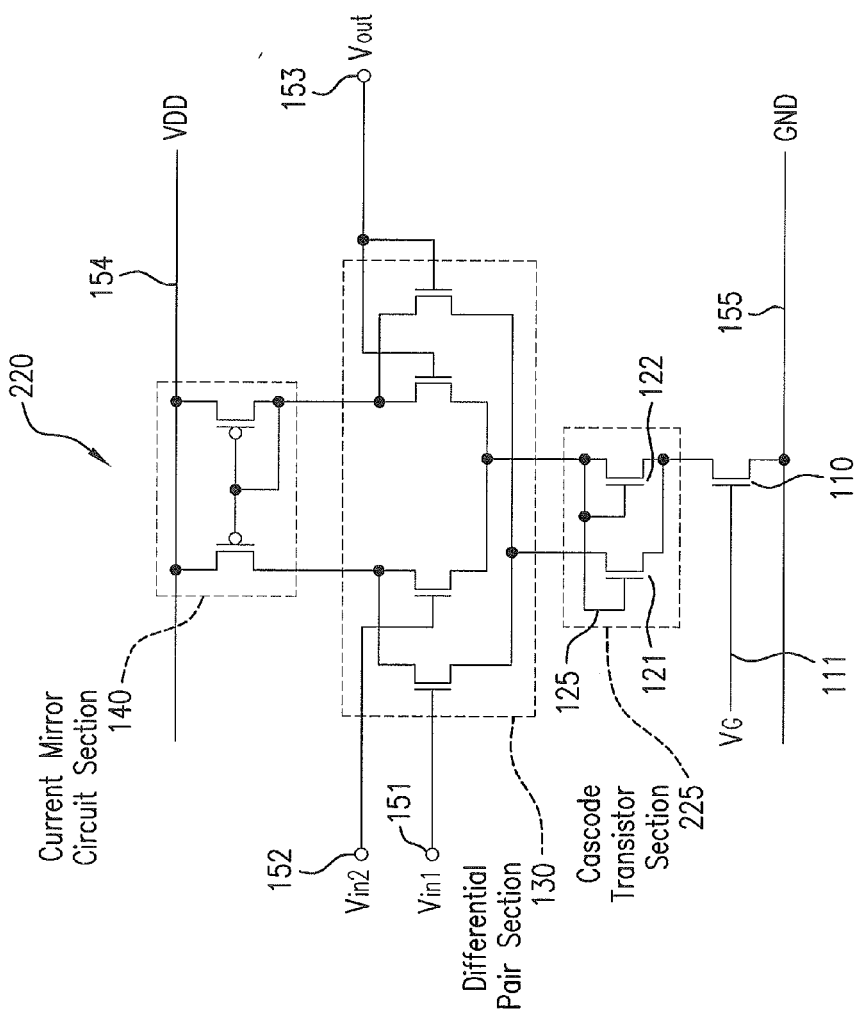
FIG. 4 shows a two-input single-output circuit according to a second modification of the first embodiment.

FIG. 4 shows a two-input single-output circuit 220 according to a second modification of the two-input single-output circuit 100 of the first embodiment. In the drawing, the driver stage 160 in FIG. 1 is not illustrated. A configuration portion different from the two-input single-output circuit 100 of the first embodiment is a cascode transistor section 225. The other configurations are the same as those of the two-input single-output circuit 100. The gate lines 125 of the transistors 121 and 122 of the cascode transistor section 225 are connected to a drain line of the transistor 122.

Figure 5:
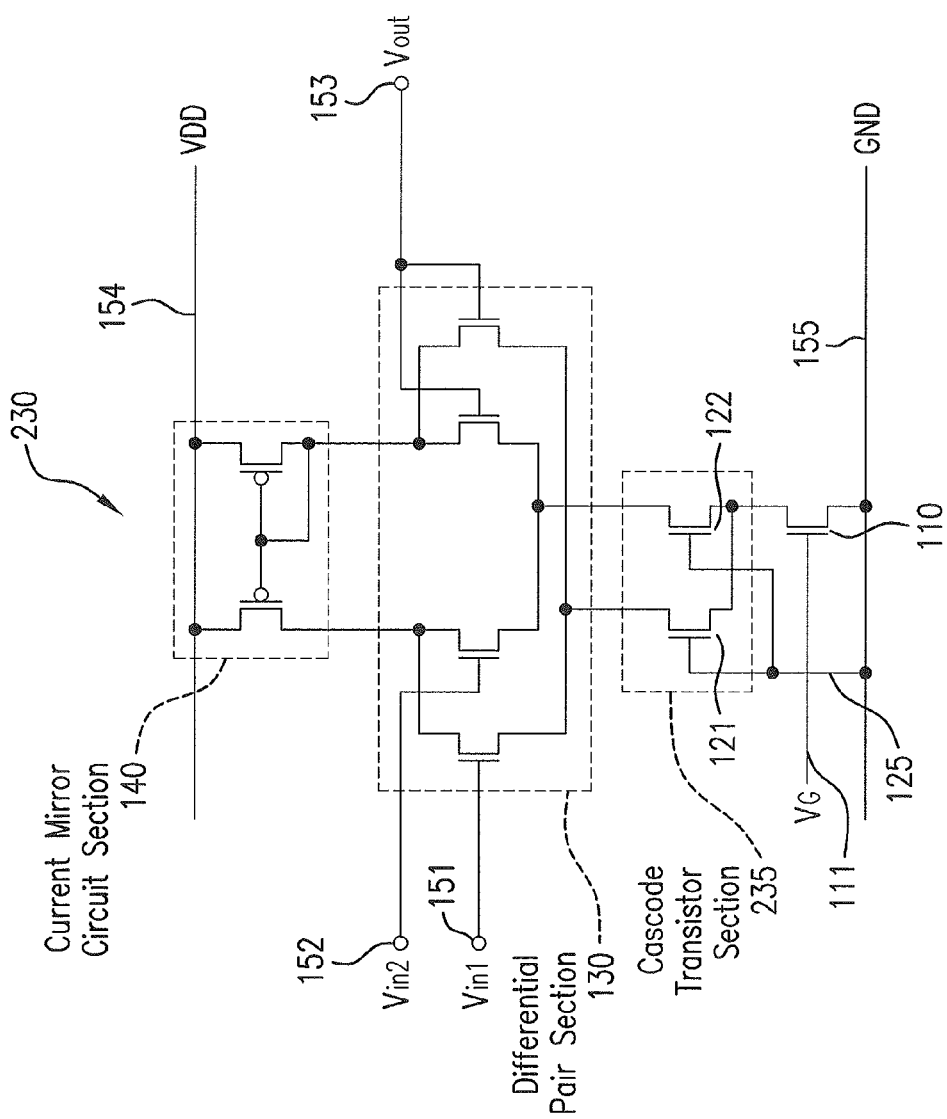
FIG. 5 shows a two-input single-output circuit according to a third modification of the first embodiment.

FIG. 5 shows a two-input single-output circuit 230 according to a third modification of the two-input single-output circuit 100 of the first embodiment. In the drawing, the driver stage 160 in FIG. 1 is not illustrated. A configuration portion different from the two-input single-output circuit 100 of the first embodiment is a cascade transistor section 235. The other configurations are the same as those of the two-input single-output circuit 100. The gate line 125 of the transistors 121 and 122 of the cascode transistor section 235 is connected to the grounding wire 155.

Even in the first to third modifications in which the respective connections are made as described above, it is possible to obtain an output voltage of a more accurate, intermediate voltage from two input voltages without using a plurality of current source transistors.

Second Embodiment

Figure 6:
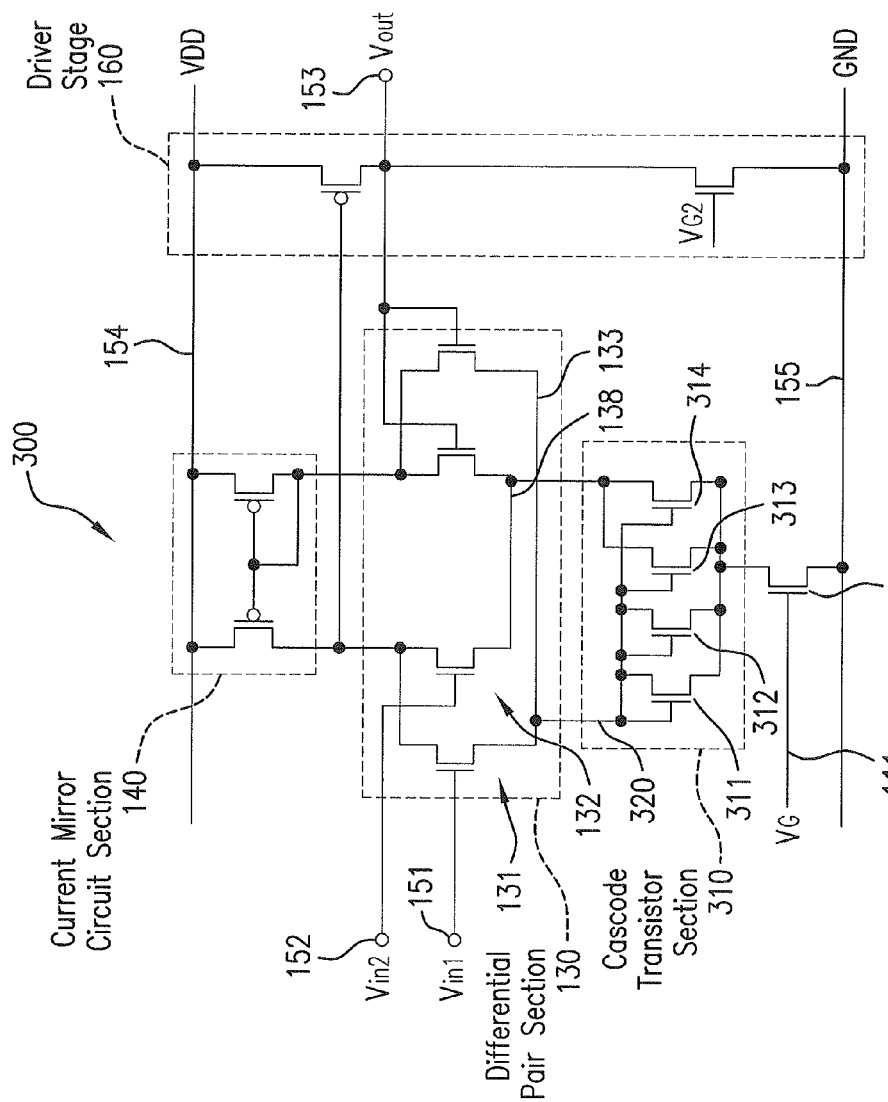
FIG. 6 shows a two-input single-output circuit according to a second embodiment of the invention.

FIG. 6 shows a two-input single-output circuit 300 according to an embodiment of the multiple-input single-output circuit of the invention. In the two-input single-output circuit 300, a configuration portion different from the two-input single-output circuit 100 of the first embodiment is a cascade transistor section 310. The other configurations are the same as those of the two-input single-output circuit 100. The cascode transistor section 310 includes four MOS transistors 311 to 314 having the same characteristics. In the same manner as the two-input single-output circuit 100 of the first embodiment, source lines of the transistors 311 to 314 are cascode-connected to the drain side of the current source transistor 110. Drain lines of the transistors 311 and 312 are connected to the source line 133 of the first differential pair 131. Drain lines of the transistors 313 and 314 are connected to the source line 138 of the second differential pair 132.

A common gate line 320 of the transistors 311 to 314 is connected to the source line 133 of the first differential pair 131. With this configuration, the current flowing into the transistors is equally divided into one-fourth. Among the four transistors 311 to 314, the two transistors 311 and 312 are connected to the source line 133 of the first differential pair 131, and the remaining two transistors 313 and 314 are connected to the source line 138 of the second differential pair 132. In the same manner as the first embodiment, therefore, the amount of the current flowing into the source line 133 is the same as that flowing into the source line 138, so that the relationship of the graph in FIG. 2 of the first embodiment is established.

Even with the configuration described above, therefore, it is possible to obtain an output of a more accurate, intermediate voltage from two input voltages without using a plurality of current source transistors.

Figure 7:
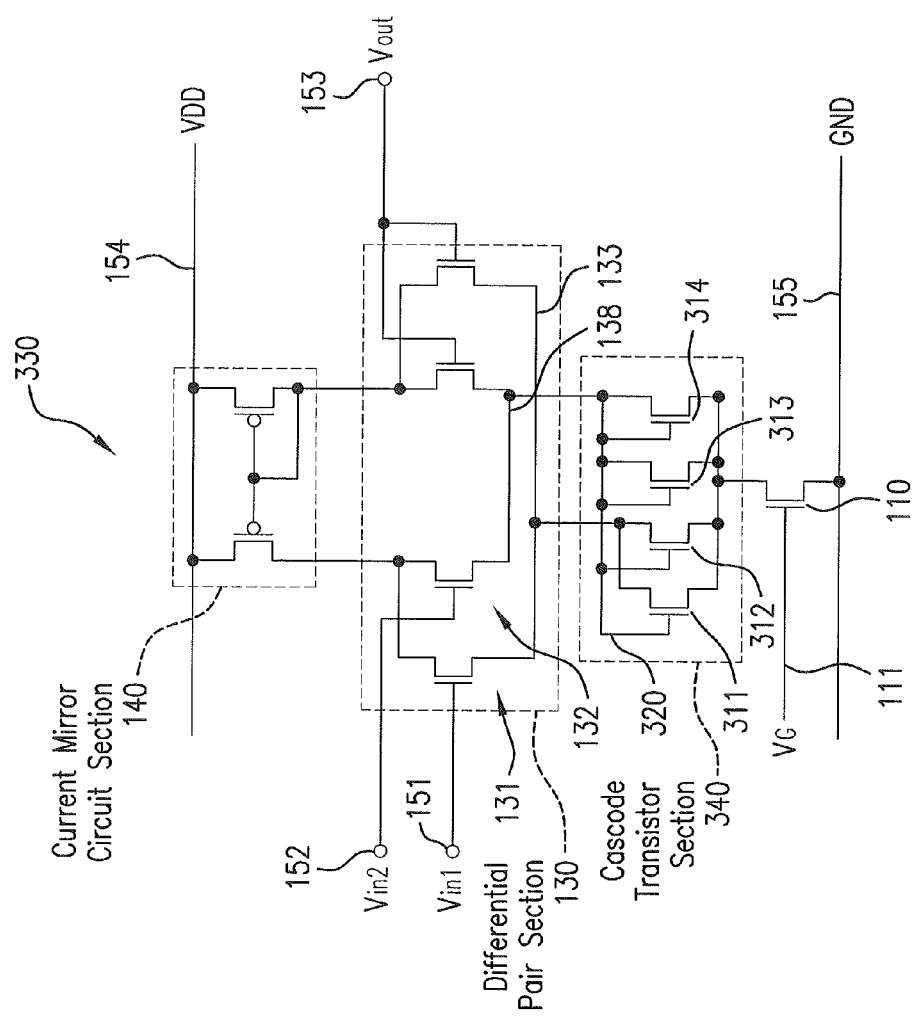
FIG. 7 shows a two-input single-output circuit according to a first modification of the second embodiment.

FIG. 7 shows a two-input single-output circuit 330 according to a first modification of the two-input single-output circuit 300 of the second embodiment. In the drawing, the driver stage 160 in FIG. 1 is not illustrated. In the two-input single-output circuit 330, a configuration portion different from the two-input single-output circuit 300 of the second embodiment is a cascode transistor section 340. The other configurations are the same as those of the two-input single-output circuit 100. The common gate line 320 of the transistors 311 to 314 of the cascode transistor section 340 is connected to the source line 138 of the second differential pair 132.

Figure 8:
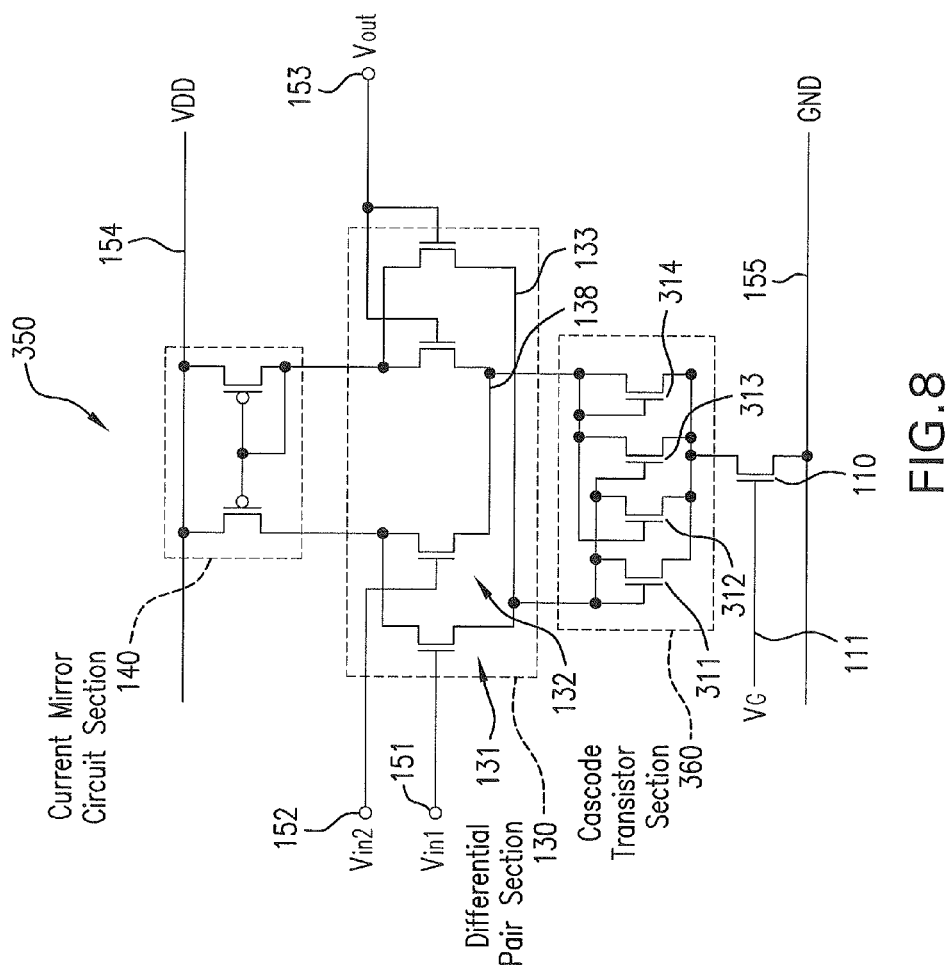
FIG. 8 shows a two-input single-output circuit according to a second modification of the second embodiment.

FIG. 8 shows a two-input single-output circuit 350 according to a second modification of the two-input single-output circuit 300 of the second embodiment. In the drawing, the driver stage 160 in FIG. 1 is not illustrated. In the two-input single-output circuit 350, a configuration portion different from the two-input single-output circuit 300 of the second embodiment is a cascode transistor section 360. The other configurations are the same as those of the two-input single-output circuit 100. The gate lines of the transistors 311 and 313 of the cascode transistor section 360 are connected to the source line 133 of the first differential pair 131. The gate lines of the transistors 312 and 314 are all connected to the source line 138 of the second differential pair 132.

In this case, the same amount of current flows from the source line 133 of the first differential pair 131 and the source line 138 of the second differential pair 132 to the respective transistors 311 and 313. The same amount of current flows from the source line 133 of the first differential pair 131 and the source line 138 of the second differential pair 132 to the respective transistors 312 and 314. That is, since the same amount of current flows from the source lines 133 and 138, the relationship of the graph in FIG. 2 of the first embodiment is established.

Accordingly, even when the connections are made like the first and second modifications, it is possible to obtain an output voltage of a more accurate, intermediate voltage from two input voltages without using a plurality of current source transistors.

Third Embodiment

Figure 9:
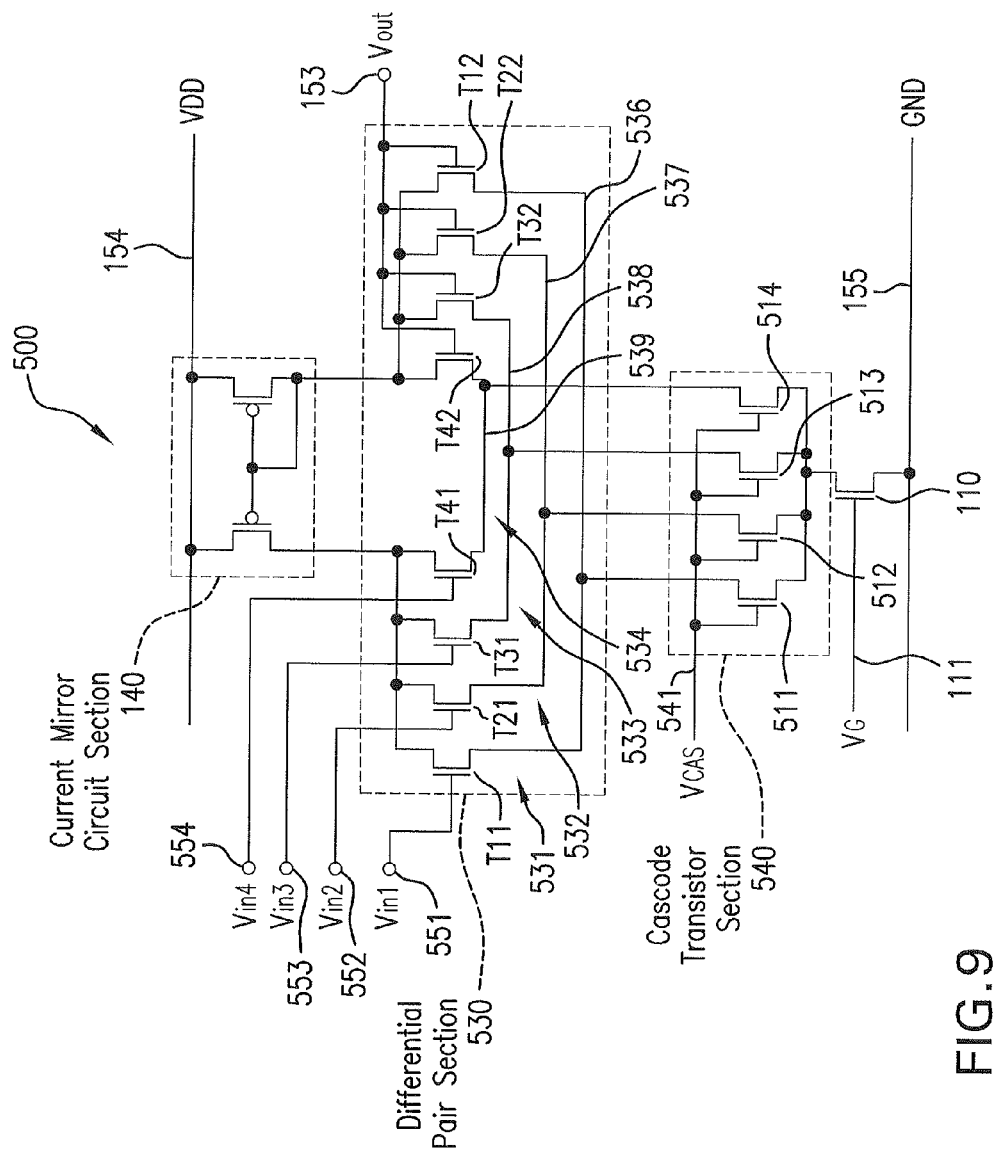
FIG. 9 shows a four-input single-output circuit according to a third embodiment of the invention.

FIG. 9 shows a four-input single-output circuit 500 according to an embodiment of the multiple-input single-output circuit of the invention. In the four-input single-output circuit 500, configuration portions different from the two-input single-output circuit 100 of the first embodiment are four input terminals 551 to 554, a cascode transistor section 540, and a differential pair section 530. The other configurations are the same as those of the two-input single-output circuit 100. In the drawing, the driver stage 160 is not illustrated. The cascade transistor section 540 includes four MOS transistors 511 to 514 having the same characteristics. In the same manner as the two-input single-output circuit 100 of the first embodiment, source lines of the transistors 511 to 514 are cascode-connected to the drain side of the current source transistor 110. The differential pair section 530 includes four differential pairs (first differential pair 531 to fourth differential pair 534) having the same configuration as the first differential pair 131 of the first embodiment.

Drain lines of the transistors 511 to 514 of the cascode transistor section 540 are respectively connected to source lines 536 to 539 of the first to fourth differential pairs 531 to 534. A gate line of the first input-side transistor T11 of the first differential pair 531 is connected to the first input terminal 551. A gate line of the second input-side transistor T21 of the second differential pair 532 is connected to the second input terminal 552. A gate line of a third input-side transistor T31 of the third differential pair 533 is connected to the third input terminal 553. A gate line of a fourth input-side transistor T41 of the fourth differential pair 534 is connected to the fourth input terminal 554.

As described in the case of the two-input single-output circuit 300 of the second embodiment, the current flowing into the transistors 511 to 514 of the cascode transistor section 540 is equally divided into one-fourth. An average voltage of the input voltages $V_{in1}$ to $V_{in4}$ applied to the respective input terminals 551 to 554 is output to the output terminal 153 as the output voltage $V_{out}$. Table 1 shows the relationship between the input voltages $V_{in1}$ to $V_{in4}$ and the output voltage $V_{out}$ in the four-input single-output circuit 500.

TABLE 1

| $V_{in1}$ (V) | $V_{in2}$ (V) | $V_{in3}$ (V) | $V_{in4}$ (V) | $V_{out}$ (V) |
|---|---|---|---|---|
| 0 | 0 | 0 | 0 | 0 |
| 0 | 0 | 0 | 4 | 1 |
| 0 | 0 | 4 | 4 | 2 |
| 0 | 4 | 4 | 4 | 3 |
| 4 | 4 | 4 | 4 | 4 |

Table 1 shows the case where a voltage of 0 V or 4 V is input to the input terminals 551 to 554 as the voltages $V_{in1}$ $V_{in2}$ $V_{in3}$ and $V_{in4}$ for easy understanding. According to the third embodiment, therefore, it is possible to configure a circuit that outputs an average voltage of input voltages without subdividing a current source transistor and to drive the circuit with a stable current because one current source transistor is used. Moreover, since the current source transistor determines a current, a transistor having an appropriate size can be selected for each of the transistor 511 to 514 of the cascode transistor section 540.

According to the third embodiment, therefore, it is possible to output a more accurate, average voltage from four input voltages without using a plurality of current source transistors.

Figure 10:
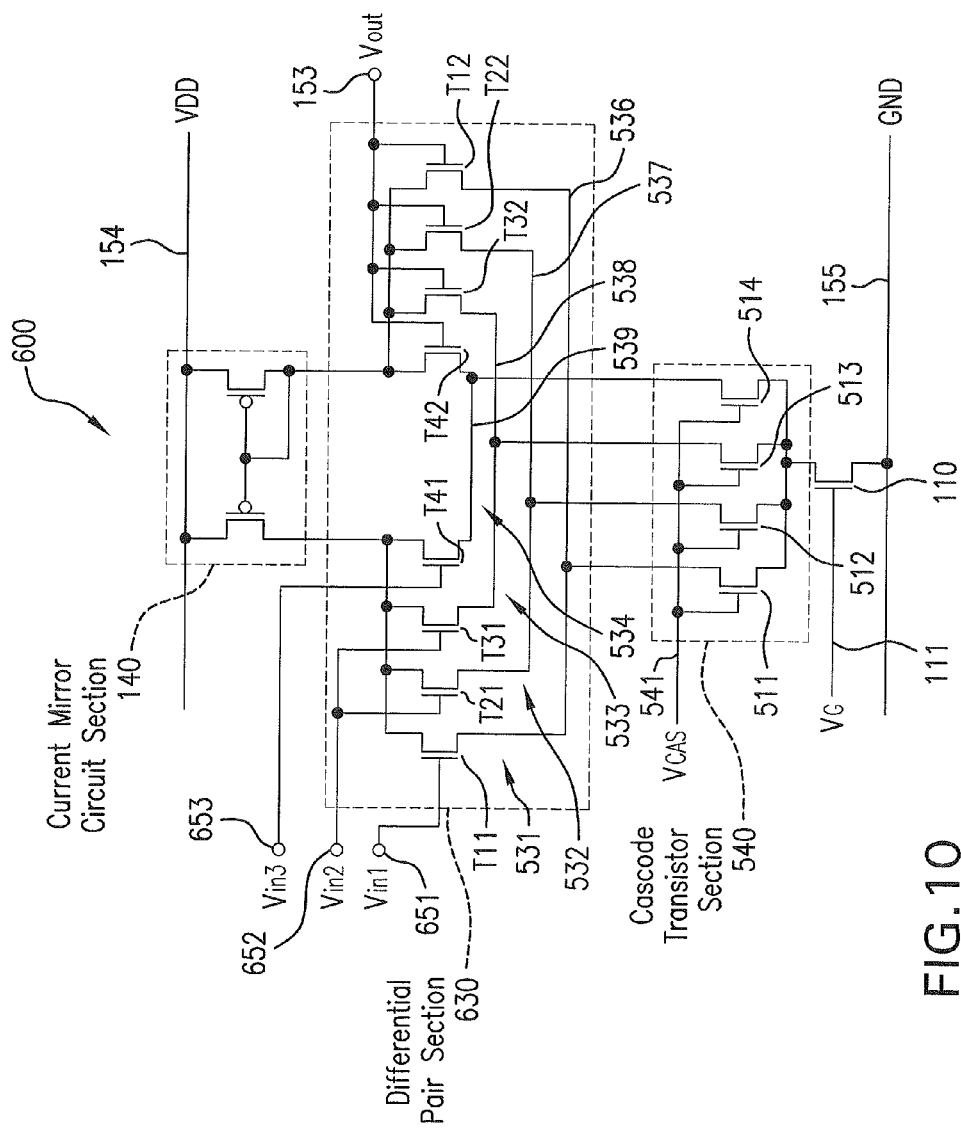
FIG. 10 shows a three-input single-output circuit according to a modification of the third embodiment.

FIG. 10 shows a three-input single-output circuit 600 according to a modification of the four-input single-output circuit 500 of the third embodiment. Also in the drawing, the driver stage 160 in FIG. 1 is not illustrated. Configuration portions different from the four-input single-output circuit 500 are three input terminals 651 to 653 and a differential pair section 630. The gate line of the second input-side transistor T21 of the second differential pair 532 and the gate line of the third input-side transistor T31 of the third differential pair 533 are both connected to the second input terminal 652. As a result, the circuit has three inputs.

With this configuration, the three-input single-output circuit 600 is substantially the same as the four-input single-output circuit 500 of the third embodiment in which the same voltage $V_{in2}$ is applied to two input terminals (552 and 553, for example). In the three-input single-output circuit 600 of the modification, therefore, the voltage applied to the second input terminal 652 is weighted double compared to the voltage applied to the first and third input terminals 651 and 653. Table 2 below shows the relationship between the input and output in the modification.

TABLE 2

| $V_{in1}$ (V) | $V_{in2}$ (V) | $V_{in3}$ (V) | $V_{out}$ (V) |
|---|---|---|---|
| 0 | 0 | 0 | 0 |
| 0 | 0 | 4 | 1 |
| 0 | 4 | 0 | 2 |
| 0 | 4 | 4 | 3 |
| 4 | 4 | 4 | 4 |

Table 2 shows the case where a voltage of 0 V or 4 V is input to the input terminals 651 to 653 as the voltages $V_{in1}$ $V_{in2}$, and $V_{in3}$ for easy understanding. As shown in Table 2, the three-input single-output circuit 600 of the modification can output five voltage values when two kinds (0 V and 4 V, for example) of voltages are input to the input terminals 651 to 653. In the modification, therefore, it is possible to obtain a weighted output voltage from three input voltages without using a plurality of current source transistors.

Fourth Embodiment

Figure 11:
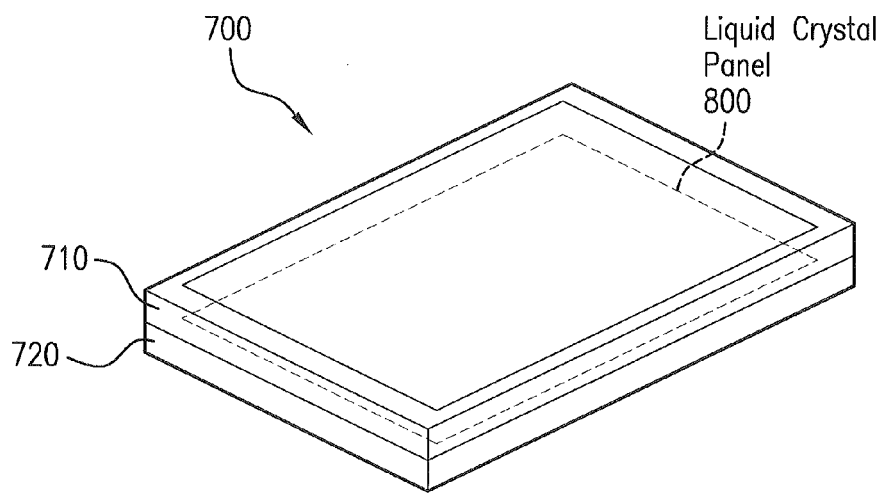
FIG. 11 schematically shows a liquid crystal display device according to a fourth embodiment of the invention.

FIG. 11 schematically shows a liquid crystal display device 700 according to an embodiment of a display device of the invention. As shown in the drawing, the liquid crystal display device 700 includes a liquid crystal panel 800 that is fixed to an upper frame 710 and a lower frame 720 so as to be interposed therebetween and a not-shown backlight unit.

Figure 12:
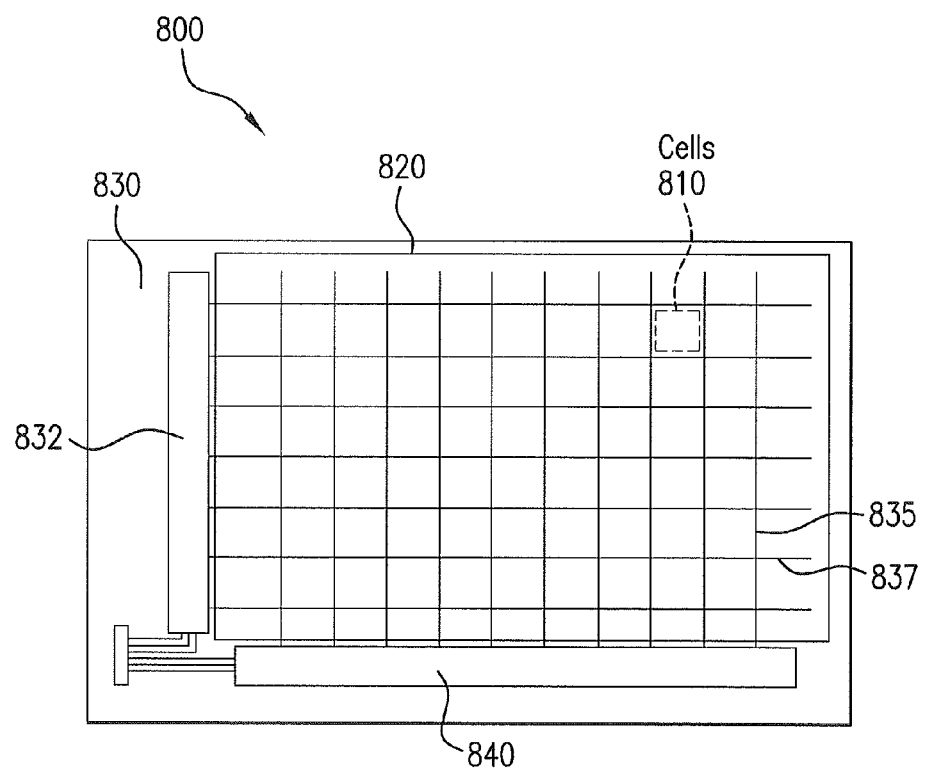
FIG. 12 shows the configuration of a liquid crystal panel in FIG. 10.

FIG. 12 shows the configuration of the liquid crystal panel 800. The liquid crystal panel 800 has two substrates of a TFT substrate 830 and a color filter substrate 820. A liquid crystal composition is sealed between the substrates. Gate signal lines 837 controlled by a drive circuit 832 and drain signal lines 835 controlled by a drive circuit 840 are run over the TFT substrate 830. These signal lines form cells 810 each functioning as a pixel of the liquid crystal display device 700. The liquid crystal panel 800 has as many cells 810 as the number corresponding to the display resolution. For preventing the drawing from being complicated, the cells are shown in a simplified manner in FIG. 12.

Figure 13:
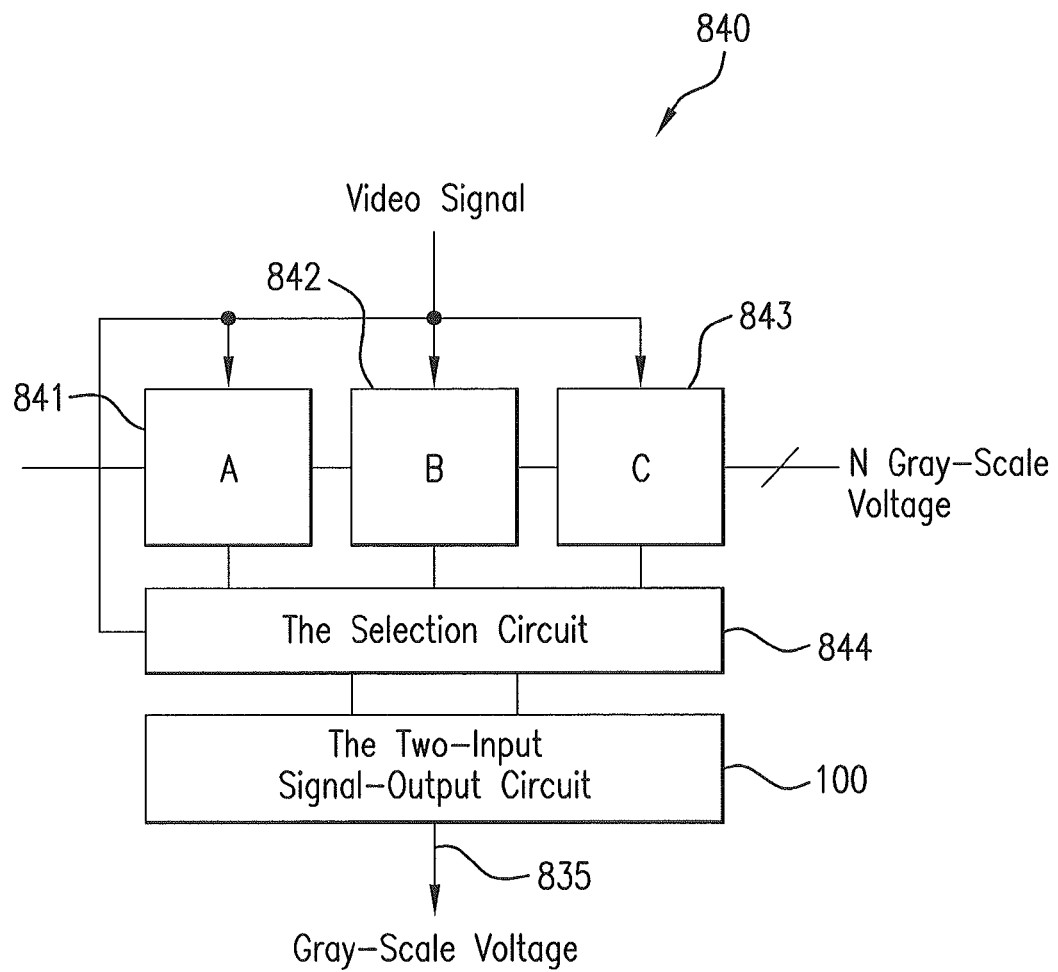
FIG. 13 is a block diagram showing a part of the processing of a drive circuit in FIG. 11.

FIG. 13 is a block diagram showing a part of the processing of the drive circuit 840. As shown in the drawing, a video signal represented by an input gray-scale value is input to an A decoder 841, a B decoder 842, and a C decoder 843 and outputs as a voltage value based on the gray-scale value and determined by selecting from N gray-scale voltages that are input to the decoders and includes N pieces of different gray-scale voltages. Next, the output voltage value is input to a selection circuit 844 and is output by selecting any two values by using a part of the video signal. Finally, the two values are input to the two-input single-output circuit 100 of the first embodiment. An average value (intermediate voltage) to be output is applied to the drain signal line 835 as a gray-scale voltage.

The liquid crystal panel 800 may adopt any of an IPS (In Plane Switching) system in which electrodes are provided only on the TFT substrate 830, and a TN (Twisted Nematic) system and a VA (Vertical Alignment) system in which electrodes are provided both on the TFT substrate 830 and the color filter substrate 820.

According to the fourth embodiment, therefore, in the drive circuit 840, it is possible to configure a circuit that outputs an average voltage of input voltages without subdividing a current source transistor and to drive the circuit by a stable current because one current source transistor is used, in the same manner as the first embodiment. Since the current source transistor determines a current, a transistor having an appropriated size can be selected for each of the transistors of the cascode transistor section.

According to the fourth embodiment, therefore, it is possible to obtain an output of an accurate intermediate voltage from two input voltages without using a plurality of current source transistors. Moreover, in a decoder circuit of a display device, an accurate gray-scale voltage can be output.

Although the liquid crystal display device is exemplified in the fourth embodiment, a display device using a light emitting body such as an organic EL (Electro-luminescent) element, or other display devices may be used.

What is claimed is:

1. A display device comprising:
a display panel; and
a multiple-input single-output circuit configured for supplying a voltage to the display panel, the multiple-input single-output circuit including:
a first differential pair formed of first and second transistors and a second differential pair formed of third and fourth transistors,
a current mirror transistor section electrically connected to drains of the first, second, third, and fourth transistors of the differential pairs,
a first input terminal electrically connected to a gate of the first transistor,
a second input terminal electrically connected to a gate of the third transistor,
an output terminal electrically connected to gates of the second and fourth transistors,
a single constant current source transistor allowing a predetermined current to flow, and
a cascode transistor section including first and second cascode transistors whose sources are electrically connected to the constant current source transistor, wherein:
sources of the first and second transistors are electrically connected to the constant current source transistor via the first cascode transistor,
sources of the third and fourth transistors are electrically connected to the constant current source transistor via the second cascode transistor,
gate electrodes of the first and second cascode transistors are electrically connected with each other, and
the gate electrodes of the first and second cascode transistors are electrically connected to the same constant voltage so that the first and second cascode transistors equally divide the current of the constant current source transistor.

2. A display device according to claim 1, wherein the number of the cascode transistors is the same as that of the differential pairs.

3. A display device according to claim 1, further comprising a third differential pair, wherein
the third differential pair is comprised of fifth and sixth transistors, and
a gate terminal of the fifth transistor of the third differential pair is electrically connected to the gate terminal of the first transistor.

4. A display device according to claim 1, further comprising a drive circuit supplying a voltage to the display panel, wherein
the drive circuit has the multiple-input single-output circuit.

5. A display device according to claim 1,
wherein the sources of each of the first and second cascode transistors are directly electrically connected to the constant current source transistor.

6. A display device comprising:
a display panel; and
a drive circuit outputting a voltage to the display panel, the drive circuit having a multiple-input single-output circuit, wherein:
the multiple-input single-output circuit includes a constant current source comprised of a single constant current source transistor, a plurality of cascode transistors, a plurality of differential pairs, and a current mirror circuit,
each of the differential pairs includes input and output transistors,
the current mirror circuit is connected to drains of the input and output transistors,
sources of the input and output transistors of the current mirror circuit are both connected to a drain of one of the cascode transistors,
sources of the cascode transistors are connected to the constant current source,
gates of the input transistors are connected to input terminals,
gates of the output transistors are connected to an output terminal,
the plurality of differential pairs are connected to the constant current source via the respective different cascode transistors,
gates of the cascode transistors are electrically connected to one another, and
gates of the cascode transistors are electrically connected to the same constant voltage so that the first and second cascode transistors equally divide the current of the constant current source transistor.

7. A display device according to claim 6, wherein the number of the cascode transistors is the same as that of the differential pairs.

8. A display device according to claim 6, wherein the gates of the plurality of input transistors are connected to an input terminal.

9. A display device according to claim 6, further comprising a drive circuit supplying a voltage to the display panel, wherein
the drive circuit includes the multiple-input single-output circuit.

10. A display device according to claim 6,
wherein the sources of each of the first and second cascode transistors are directly electrically connected to the constant current source transistor.

* * * * *